US010365169B2

(12) United States Patent
Ma (10) Patent No.: US 10,365,169 B2
(45) Date of Patent: Jul. 30, 2019

(54) TEMPERATURE/VOLTAGE SENSOR CALIBRATION (71) Applicant: Infineon Technologies AG, Neubiberg (DE)

(72) Inventor: Fan Yung Ma, Singapore (SG)

(73) Assignee: Infineon Technologies AG, Neubiberg (DE)

(*) Notice: Subject to any disclaimer, the term of this patent is extended or adjusted under 35 U.S.C. 154(b) by 187 days.

(21) Appl. No.: 15/483,784

(22) Filed: Apr. 10, 2017

(65) Prior Publication Data
US 2018/0292271 A1 Oct. 11, 2018

(51) Int. Cl.
G01K 15/00 (2006.01)
G01R 35/00 (2006.01)
G01K 7/01 (2006.01)

(52) U.S. Cl.
CPC .......... G01K 15/005 (2013.01); G01K 7/015 (2013.01); G01R 35/005 (2013.01)

(58) Field of Classification Search
USPC ................................. 374/1, 100, 163, 183
See application file for complete search history.

(56) References Cited

U.S. PATENT DOCUMENTS

| 5,282,685 A * | 2/1994 | Koegler ............... G01K 7/25 340/515 |
| 6,591,210 B1 * | 7/2003 | Lorenz ................ G01K 3/005 323/313 |
| 6,736,540 B1 * | 5/2004 | Sheehan ................ G01K 7/01 327/572 |
| 6,957,910 B1 * | 10/2005 | Wan ..................... G01K 7/01 327/512 |
| 7,164,259 B1 * | 1/2007 | Megaw ................. G05F 3/30 323/313 |
| 7,399,116 B2 * | 7/2008 | Takeuchi ............. G01K 15/00 374/1 |
| 9,329,615 B2 * | 5/2016 | Neidorff ............... G05F 3/30 |
| 9,520,881 B1 * | 12/2016 | Das ..................... H03K 3/0231 |
| 2003/0086476 A1 * | 5/2003 | Mizuta ................ G01K 15/00 374/178 |
| 2004/0004992 A1 * | 1/2004 | Aota ..................... G01K 7/01 374/163 |
| 2004/0243950 A1 * | 12/2004 | Burstein ................ G06F 1/26 330/252 |
| 2005/0071116 A1 * | 3/2005 | Kim ..................... G01K 3/005 702/132 |
| 2005/0216220 A1 * | 9/2005 | Kim ..................... G01K 3/005 702/130 |

(Continued)

OTHER PUBLICATIONS

Pertijs, et al., "A CMOS Smart Temperature Sensor With a 3σ Inaccuracy of ±0.1° C. from −55° to 125°," IEEE Journal of Solid-State Circuits, vol. 40, No. 12, Dec. 2005, pp. 2805-2815.

(Continued)

Primary Examiner — Mirellys Jagan
(74) Attorney, Agent, or Firm — Shumaker & Sieffert, P.A.

(57) ABSTRACT

Techniques for calibrating both temperature sensor circuitry and voltage sensor circuitry of temperature/voltage sensor circuitry by trimming variation in a bandgap reference voltage, which is common between the temperature sensor circuitry and the voltage sensor circuitry, to zero or approximately zero using a single trim value.

24 Claims, 8 Drawing Sheets (56) References Cited

U.S. PATENT DOCUMENTS

| | | | | |
|---|---|---|---|---|
| 2006/0104330 | A1* | 5/2006 | Ho Limb | G01K 7/223 |
| | | | | 374/1 |
| 2007/0133319 | A1* | 6/2007 | Noichi | G11C 5/147 |
| | | | | 365/189.09 |
| 2008/0069176 | A1* | 3/2008 | Pertijs | G01K 7/01 |
| | | | | 374/1 |
| 2008/0091378 | A1* | 4/2008 | Jeong | G01K 7/01 |
| | | | | 702/130 |
| 2010/0316086 | A1* | 12/2010 | Engelstad | G01K 1/14 |
| | | | | 374/1 |
| 2013/0136149 | A1* | 5/2013 | Soenen | G01K 7/16 |
| | | | | 374/1 |
| 2014/0362249 | A1* | 12/2014 | Yang | A63H 3/28 |
| | | | | 348/222.1 |
| 2014/0376586 | A1* | 12/2014 | Dawson | G01D 3/0365 |
| | | | | 374/1 |
| 2015/0369674 | A1* | 12/2015 | Ma | G01K 7/015 |
| | | | | 374/1 |

OTHER PUBLICATIONS

Shalmany, et al., "A Micropower Battery Current Sensor with ±0.03% (3σ) Inaccuracy from −40 to +85° C.," ISSCC 2013, Session 22, Feb. 20, 2013, Sensors & Displays, 22.4, pp. 386-388.

\* cited by examiner

TEMPERATURE/VOLTAGE SENSOR CALIBRATION

BACKGROUND

Accuracy of integrated temperature sensors, such as BJT-based and CMOS-based temperature sensors, is typically limited by $V_{BE}$ (bandgap) variation, and has been reported as about +/−2° C. over the temperature range of −55° C. to +125° C. without calibration. Therefore, for sensors design-limited by $V_{BE}$ variation, calibration is typically required for accuracy better than +/−2° C.

SUMMARY

The present disclosure is directed to techniques for calibrating both temperature sensor circuitry and voltage sensor circuitry of temperature/voltage sensor circuitry by trimming variation in a bandgap reference voltage, which is common between the temperature sensor circuitry and the voltage sensor circuitry, to zero or approximately zero using a single trim value.

As an example, a method may include or comprise, by sensor calibration circuitry, receiving temperature sensor data or voltage sensor data output by sensor circuitry that is configured to generate temperature and voltage sensor data, calculating a trim parameter value based on the temperature sensor data or the voltage sensor data output by the sensor circuitry, and calibrating, using the trim parameter value, the sensor circuitry to compensate error in the temperature sensor data and the voltage sensor data introduced from variation in a voltage reference of the sensor circuitry.

As another example, a circuit may include or comprise sensor calibration circuitry that is configured to receive temperature sensor data and voltage sensor data output by sensor circuitry that is configured to generate temperature and voltage sensor data, calculate a trim parameter value based on either the temperature sensor data or the voltage sensor data output by the sensor circuitry, and calibrate, using the trim parameter value, the sensor circuitry to compensate error in the temperature sensor data and the voltage sensor data introduced from variation in a voltage reference of the sensor circuitry.

As yet another example, a method may include or comprise, by sensor calibration circuitry configured to calibrate temperature sensor circuitry and voltage sensor circuitry of an integrated circuit using a common trim parameter value, calculating the common trim parameter value for the temperature sensor circuitry and the voltage sensor circuity, and instantiating a sequence to calibrate the temperature sensor circuitry and the voltage sensor circuitry of the integrated circuit using the common trim parameter value.

Other examples are possible.

DETAILED DESCRIPTION

The present disclosure is directed to techniques for calibrating both temperature sensor (TS) circuitry and voltage sensor (VS) circuitry of temperature/voltage (TV) sensor circuitry by trimming variation in a bandgap reference voltage ($V_{BE}$), which is common between the TS circuitry and the VS circuitry, to zero or approximately zero (i.e., not precisely zero, but +/− deviation around zero) using a single trim value ($\alpha$). The following analysis supports such an implementation, which is useful and cost effective for product trim testing and storage of the trim value for product trim testing, and further simplifies system/product computation of trim readings for TS and VS modes of the TV sensor circuitry.

For TS mode trim, consider equations {1}-{2}:

$$D_o(T) = A * \mu(T) + B \quad \{1\};$$

and $$\mu = \alpha * \Delta V_{BE} / (\alpha * \Delta V_{BE} + V_{BE}) \quad \{2\}.$$

For VS mode trim, consider equations {3}-{4}:

$$D_o(V) = V_{REF} * \mu(V) \quad \{3\};$$

and $$\mu = V_{IN}/V_{REF} = V_{IN}/(\alpha * \Delta V_{BE} + V_{BE}) \quad \{4\}.$$

For TS mode trim, typical methods include single-point trim and two-point trim. Single-point trim is cost effective for production as only a single temperature ($T_{CAL}$) insertion is required for the condition that $V_{BE}$ variation is the major contributor to inaccuracy. For single-point trim, a gain trim is performed by changing either A or $\alpha$ such that $D_O(T_{CAL}) = T_{CAL}$. For two-point trim, two temperature insertions are performed to trim TS gain (A or $\alpha$) and offset (B). Here, the trim result is $D_o(T_{CAL1}) = T_{CAL1}$, $D_o(T_{CAL2}) = T_{CAL2}$. In practice, for single-point and two-point trim, VS mode trim is not considered, wherein the target VS trim result is $D_o(V_{IN}) = V_{IN}$ at $T_{CAL}$. In contrast to the typical methods, it is contemplated that a common single temperature point trim may be implemented, which calibrates both TS and VS modes. To demonstrate, consider equations {2} and {4} as shown above. The common trim parameter is $\alpha$.

Next, for TS mode trim, rewrite equation {2} as equation {2a}:

$$\mu = \alpha * \Delta V_{BE} / (\alpha * \Delta V_{BE} + V_{BE}) = \quad \{2a\}$$
$$\alpha * \Delta V_{BE} / (\alpha * \Delta V_{B0E} + V_{BEideal} + V_{BEerror})$$
$$= [\alpha_0 * \Delta V_{BE} / (\alpha_0 * \Delta V_{BE} + V_{BEideal})] *$$
$$[(\alpha/\alpha_0)/(1 + \{(\alpha - \alpha_0) * \Delta V_{BE} + V_{BEerror}\}/(\alpha_0 * \Delta V_{BE} + V_{BEideal}))]$$

-continued $$= [\alpha_0 * \Delta V_{BE} / V_{REFideal}] *$$
$$[(\alpha/\alpha_0)/(1 + \{(\alpha - \alpha_0) * \Delta V_{BE} + V_{BEerror}\}/V_{REFideal})]$$
$$= \mu_{ideal} * (\alpha/\alpha_0)/F(\alpha).$$

With reference to equation {2a}, equations {5}-{7} are written as:

$$V_{REFideal} = \alpha_0 * \Delta V_{BE} + V_{BEideal} \quad \{5\};$$

$$\mu_{ideal} = \alpha_0 * \Delta V_{BE} / V_{REFideal} \quad \{6\};$$

and $$F(\alpha) = 1 + [(\alpha - \alpha_0) * \Delta V_{BE} + V_{BEerror}] / V_{REFideal} \quad \{7\};$$

and

With reference to equation {2a}, equations {2b} is written as:

$$[\mu | \alpha = \alpha_0] = \mu_{ideal} / F(\alpha_0) = \mu_{ideal} / [1 + V_{BEerror} / V_{REFideal}];$$

$$\mu_r^* = [\mu | \alpha = \alpha_0] / \mu_{ideal} = 1/[1 + V_{BEerror} / V_{REFideal}];$$

and $$V_{BEerror} = (1/\mu_r^* - 1) * V_{REFideal} \quad \{2b\}.$$

With trim target $F(\alpha)=1$ such that @T=$T_{cal}$, rewrite equation {7} as equation {7a}:

$$((\alpha - \alpha_0) * \Delta V_{BE} + V_{BEerror}) / V_{REFideal} = 0 \quad \{7a\}.$$

Solving equation {7a} for α, rewrite equation {7a} as equation {7b}:

$$\alpha = \alpha_0 - V_{BEerror} / \Delta V_{BE} \quad \{7b\}.$$

Substituting value for $V_{BEerror}$ using $\mu_r^*$ as per equation {2b}, rewrite equation {7b} as equation {8}:

$$\alpha/\alpha_0 = (1 + \mu_{ideal} - 1/\mu_r^*)/\mu_{ideal}, \text{ where} \quad \{8\}$$

$$\mu_r^* = [\mu(Tcal) | \alpha = \alpha_0] / \mu_{ideal}(Tcal)$$
$$= [\alpha_0 * \Delta V_{BE}(Tcal) / (\alpha_0 * \Delta V_{BE}(Tcal) + V_{BE}(Tcal))] / \mu_{ideal}(Tcal).$$

Using α trim value as shown in equation {8}, equations {8a}-{8b} may be written as:

$$\mu = \mu_{ideal} * (\alpha/\alpha_0) \quad \{8a\};$$

and $$\mu_{ideal} = \mu * (\alpha_0/\alpha) \quad \{8b\},$$

which represents scaling after trim.

Next, for VS mode trim, rewrite equation {4} as equation {4a}:

$$\mu = (V_{IN} / V_{REFideal}) / F(\alpha) \quad \{4a\}.$$

Rewrite equation {4a} as equation {4b}:

$$\mu = \mu_{ideal} / F(\alpha) \quad \{4b\},$$

where $$\mu_{ideal} = V_{IN} / V_{REFideal} \quad \{9\}.$$

Applying α trim value as per equation {8} to VS mode, the following holds:

$$F(\alpha) = 1;$$

and $$\mu = \mu_{ideal}.$$

The above analysis shows that a common single temperature point trim may be implemented whereby a single point calibration of TS circuitry of TV sensor circuitry of the present disclosure may first be performed, which is then applicable to VS circuitry of the TV sensor circuitry. The method of FIG. 1, discussed below, is an example of such an implementation. The present disclosure however is not so limited. The following analysis, which is similar to the above analysis, shows that a single point calibration of VS circuitry of TV sensor circuitry of the present disclosure may first be performed, which is then applicable to TS circuitry of the TV sensor circuitry.

Specifically, for VS mode trim, rewrite equation {4} as equation {10}:

$$\mu = V_{IN} / (\alpha * \Delta V_{BE} + V_{BE}) = V_{IN} / (\alpha * \Delta V_{BE} + V_{BEideal} + V_{BEerror}) \quad \{10\}$$
$$= [V_{IN} / (\alpha_0 * \Delta V_{BE} + V_{BEideal})] *$$
$$[1/(1 + \{(\alpha - \alpha_0) * \Delta V_{BE} + V_{BEerror}\}/(\alpha_0 * \Delta V_{BE} + V_{BEideal}))]$$
$$= [V_{IN} / V_{REFideal}] * [1/(1 + \{(\alpha - \alpha_0) * \Delta V_{BE} + V_{BEerror}\}/V_{REFideal})]$$
$$= \mu_{ideal} / F(\alpha).$$

With reference to equation {10}, equations {5}, {7}, and {9} (see also above) are written as:

$$V_{REFideal} = \alpha_0 * \Delta V_{BE} + V_{BEideal} \quad \{5\};$$

$$\mu_{ideal} = V_{IN} / V_{REFideal} \quad \{9\};$$

and $$F(\alpha) = 1 + [(\alpha - \alpha_0) * \Delta V_{BE} + V_{BEerror}] / V_{REFideal} \quad \{7\}.$$

With trim target $F(\alpha)=1$ such that @T=$T_{cal}$, rewrite equation {7} as equation {7a}:

$$((\alpha - \alpha_0) * \Delta V_{BE} + V_{BEerror}) / V_{REFideal} = 0 \quad \{7a\}.$$

Solving equation {7a} for α, rewrite equation {7a} as equation {7b}:

$$\alpha = \alpha_0 - V_{BEerror} / \Delta V_{BE} \quad \{7b\}.$$

Substituting value for $V_{BEerror}$ using $\mu_r^*$, rewrite equation {7b} as equation {11}:

$$\alpha = \alpha_0 - [(1/\mu_r^*) - 1] * V_{REFideal}(T_{cal}) / \Delta V_{BE}(T_{cal}) \quad \{11\},$$

where $$\mu_r^* = [\mu | \alpha = \alpha_0] / \mu_{ideal} = 1/[1 + V_{BEerror}(T_{cal}) / V_{REFideal}(T_{cal})];$$

$$\mu_{ideal}(T_{cal}) = V_{IN}(T_{cal}) / V_{REFideal}(T_{cal})].$$

To calculate, values of $V_{IN}(T_{cal})$, $V_{REFideal}(T_{cal})$ and $\Delta V_{BE}(T_{cal})$ should be known.

Using α trim value as shown in equation {11}, equation {10} may be written as:

$$\mu = \mu_{ideal} \quad \{10a\}.$$

Next, for TS mode trim, rewrite equation {2} as equation {2a}:

$$\mu = \alpha * \Delta V_{BE} / (\alpha * \Delta V_{BE} + V_{BE}) = \quad \{2a\}$$

$$\alpha * \Delta V_{BE} / (\alpha * \Delta V_{B0E} + V_{BEideal} + V_{BEerror})$$

$$= [\alpha_0 * \Delta V_{BE} / (\alpha_0 * \Delta V_{BE} + V_{BEideal})] *$$

$$[(\alpha/\alpha_0) / (1 + \{(\alpha - \alpha_0) * \Delta V_{BE} + V_{BEerror}\} / (\alpha_0 * \Delta V_{BE} + V_{BEideal}))]$$

$$= [\alpha_0 * \Delta V_{BE} / V_{REFideal}] *$$

$$[(\alpha/\alpha_0) / (1 + \{(\alpha - \alpha_0) * \Delta V_{BE} + V_{BEerror}\} / V_{REFideal})]$$

$$= \mu_{ideal} * (\alpha/\alpha_0) / F(\alpha).$$

Applying equation {11}, F(α)=1:

$$\mu = \mu_{ideal} * (\alpha/\alpha_0) \quad \{8a\};$$

and $$\mu_{ideal} = \mu * (\alpha_0/\alpha) \quad \{8b\}.$$

Equation {8b} represents scaling after trim and is the same result as initially derived. Thus, a single point calibration of VS circuitry of the TV sensor circuitry of the present disclosure may first be performed, which is then applicable to TS circuitry of the TV sensor circuitry. Alternatively, as initially derived, a common single temperature point trim may be implemented whereby a single point calibration of TS circuitry of the TV sensor circuitry of the present disclosure may first be performed, which is then applicable to VS circuitry of the TV sensor circuitry. The method of FIG. 1, discussed below, is an example of such an implementations(s).

Figure 1:
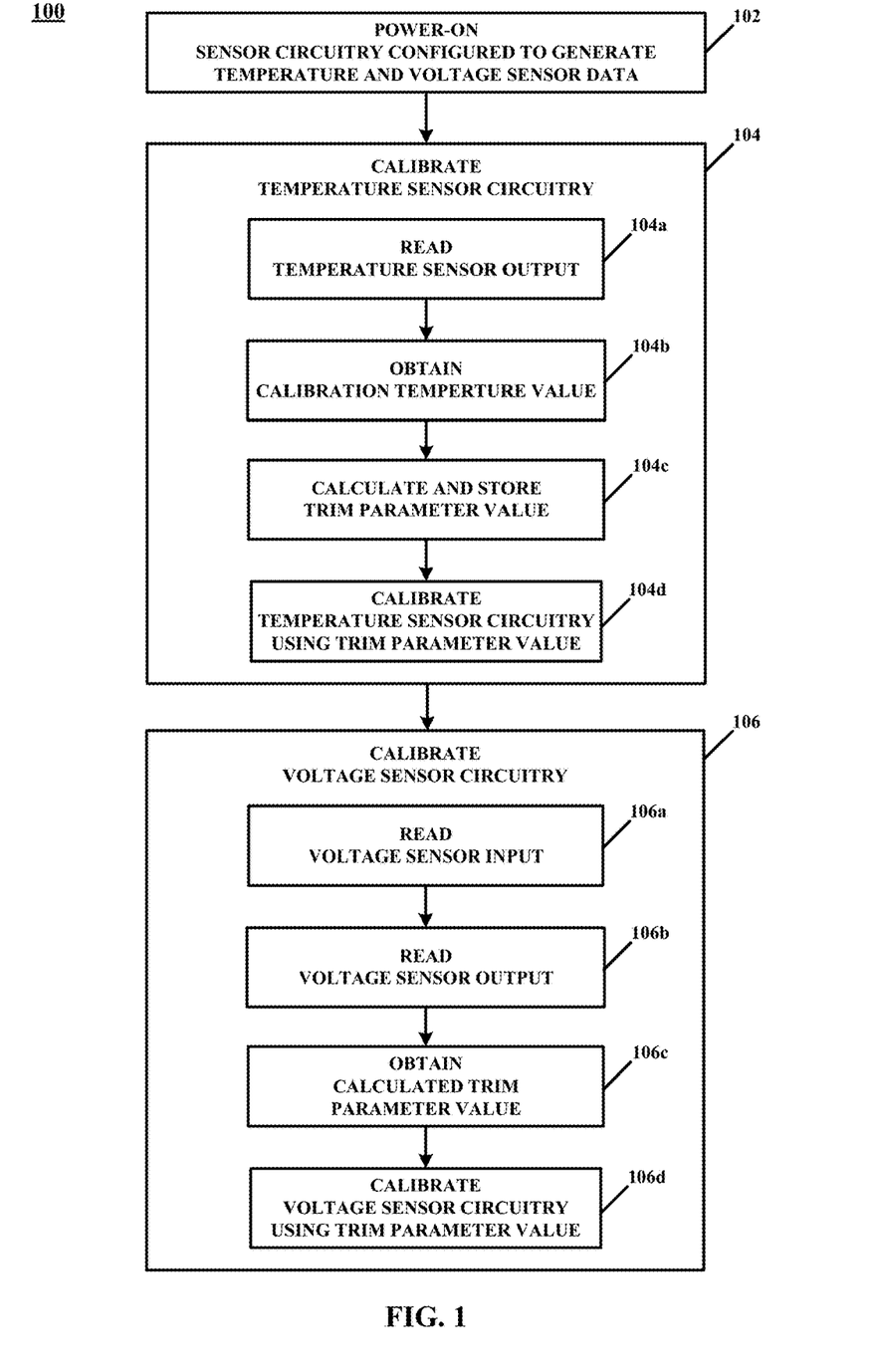
FIG. 1 is a flow diagram that shows an example method for calibrating temperature/voltage sensor circuitry according to the disclosure.

Specifically, FIG. 1 shows an example method 100 for calibrating TV sensor circuitry whereby TV sensor circuitry is initially powered-on (step 102), as part of a calibration process during production or manufacture for example, and then a single point (temperature) calibration of TS circuitry of the TV sensor circuitry is performed using a trim parameter value calculated during calibration of the TS circuitry (step 104). Next, calibration of VS circuitry of the TV sensor circuitry is performed using the same trim parameter value calculated during calibration of the TS circuitry (step 106).

In this example, an output of the TS circuitry is read or obtained (step 104a), along with a temperature value (e.g., 23° C.) at if time (e.g., t=$t_1$) that corresponds with the calibration of the TS circuitry (step 104b), and trim parameter value α then calculated and stored in a non-transitory computer memory and used to calibrate the TS circuitry (steps 104c-d). In practice, the trim parameter value α is calculated as per equation {8} shown above, and is applied with scaling as per equation {1} shown above (e.g., $D_o(T)=A*\mu(\alpha trim, T)*(\alpha_0/\alpha)+B)$). Next, at a time (e.g., t=$t_2$) that is subsequent the time that corresponds with the calibration of the TS circuitry, an input of the VS circuitry is read or obtained (step 106a), along with an output of the VS circuitry that corresponds with the input (step 106b), and then the trim parameter value α is retrieved from the non-transitory computer memory and used to calibrate the VS circuitry (steps 106c-d). In practice, the trim parameter value α is applied with scaling as per equation {3} shown above (e.g., $D_o(V)=V_{REF}*\mu(\alpha trim, V)$). Thus, the method 100 of FIG. 1 is an example such that a common single temperature point trim may be implemented whereby a single point calibration of TS circuitry of TV sensor circuitry of the present disclosure may first be performed, which is then applicable to VS circuitry of the TV sensor circuitry. The present disclosure however is not so limited.

In particular, the sequence as shown in the method 100 of FIG. 1 may be changed whereby TV sensor circuitry is initially powered-on (e.g., step 102), as part of a calibration process during production or manufacture for example, and then a single point (temperature) calibration of VS circuitry of the TV sensor circuitry is performed using a trim parameter value calculated during calibration of the VS circuitry (e.g., step 104). Next, calibration of TS circuitry of the TV sensor circuitry is performed using the same trim parameter value calculated during calibration of VS circuitry (e.g., step 106). In this example, the trim parameter value α is calculated as per equation {11} shown above, and is applied with scaling as per equation {3} shown above (e.g., $D_o(V)=V_{REF}*\mu(\alpha trim, V)$ during a process step to calibrate VS circuitry of the TV sensor circuitry. Then, the trim parameter value α is applied with scaling as per equation {1} shown above (e.g., $D_o(T)=A*\mu(\alpha trim, T)*(\alpha_0/\alpha)+B)$) during a process step to calibrate TS circuitry of the TV sensor circuitry.

In this manner, a single point calibration of VS circuitry of TV sensor circuitry of the present disclosure may first be performed, which is then applicable to TS circuitry of the TV sensor circuitry. Alternatively, a common single temperature point trim may be implemented whereby a single point calibration of TS circuitry of TV sensor circuitry of the present disclosure may first be performed, which is then applicable to VS circuitry of the TV sensor circuitry. Such a technique(s) is substantially different than typical techniques whereby calibration trim that is performed for temperature sensing is unsuitable for voltage sensing so that a separate calibration trim (using separate calibration parameters) is required to obtain high accuracy voltage sensing. This increases calibration costs and also calibration parameter storage. With the techniques of the present disclosure, however, high accuracy temperature and voltage sensing may be obtained using a single, common calibration trim value, which is advantageous as temperature and voltage sensing are increasingly needed for a variety of system applications to monitor signals and apply compensation/correction due to environmental factors. An example of such an application is illustrated in FIG. 2.

Figure 2:
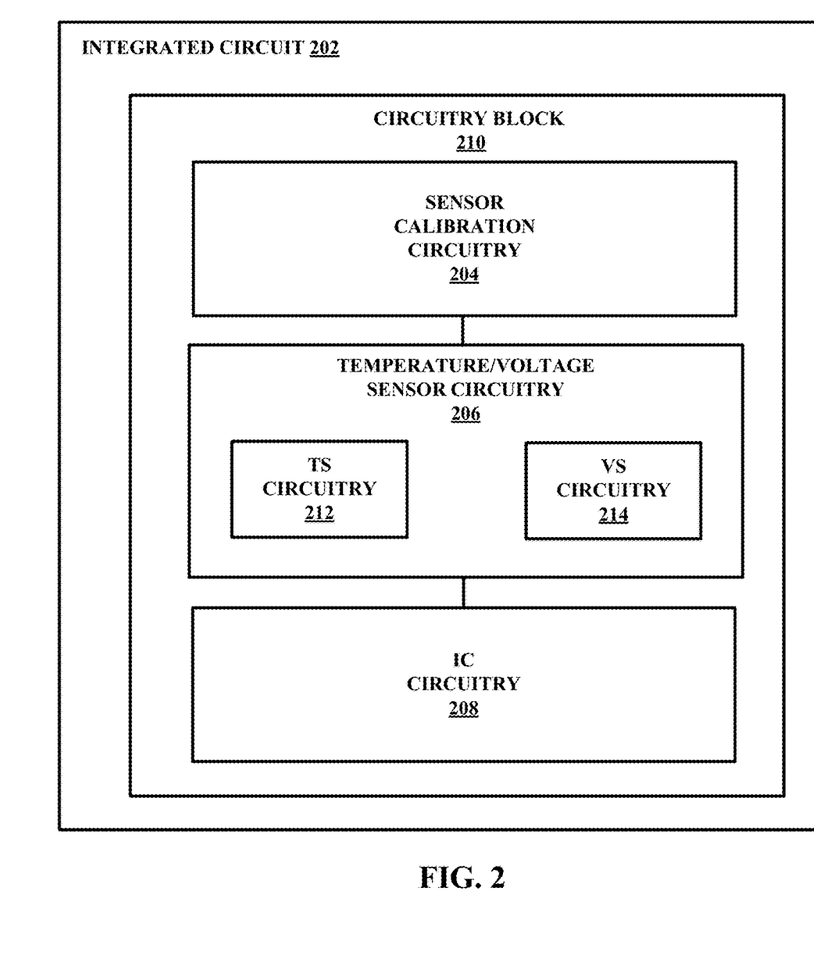
FIG. 2 is a block diagram that shows an example integrated circuit that includes temperature/voltage sensor circuitry according to the disclosure.
Figure 3:
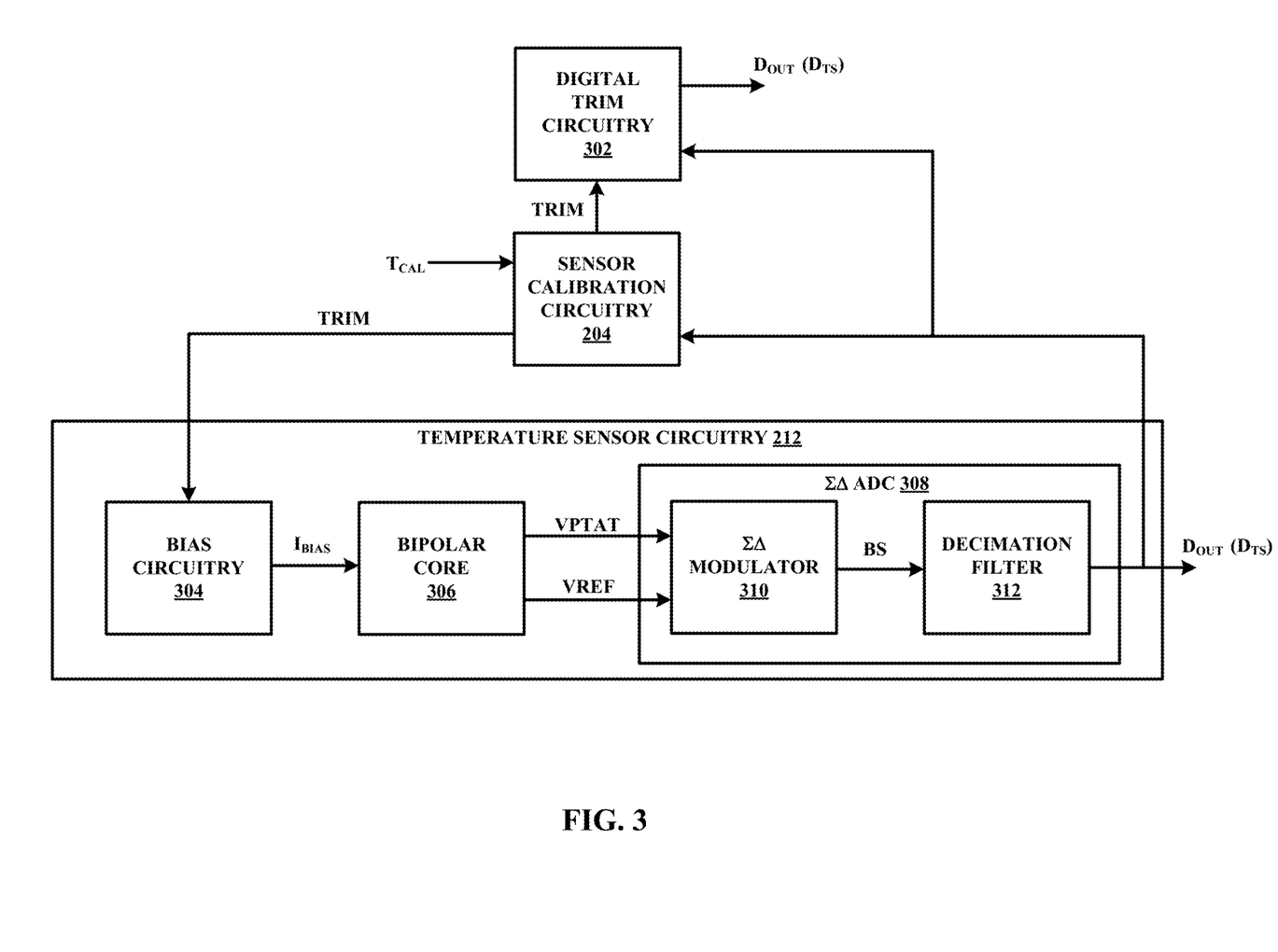
FIG. 3 is a block diagram that shows aspects of the temperature/voltage sensor circuitry of FIG. 2 in first example detail.
Figure 4:
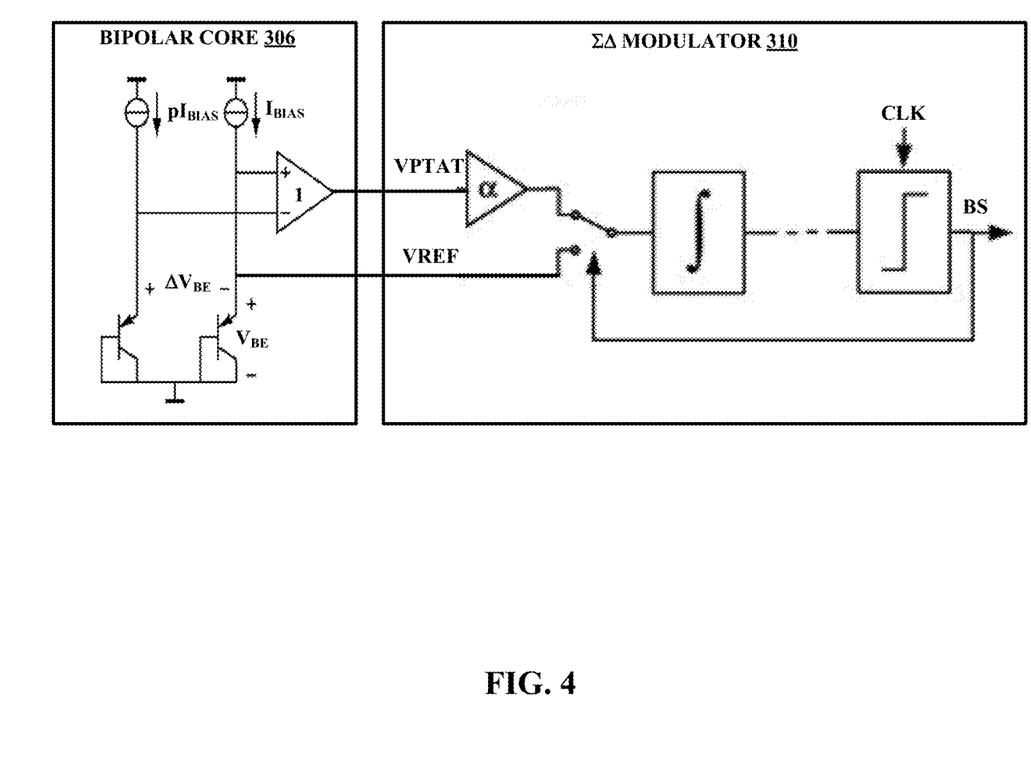
FIG. 4 is a block diagram that shows aspects of the circuitry of FIG. 3 in greater detail.
Figure 5:
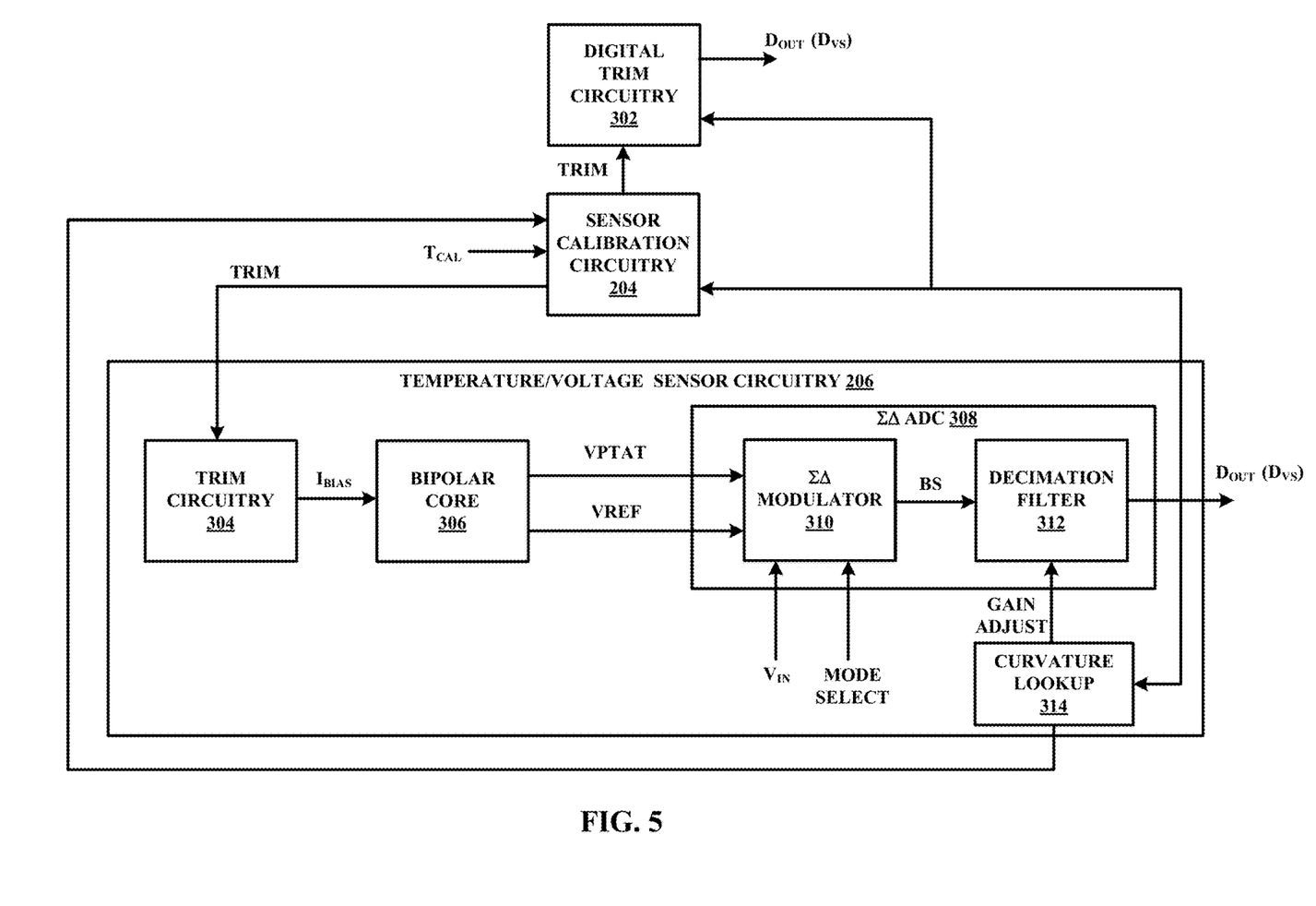
FIG. 5 is a block diagram that shows the temperature/voltage sensor circuitry of FIG. 2 in second example detail.
Figure 6:
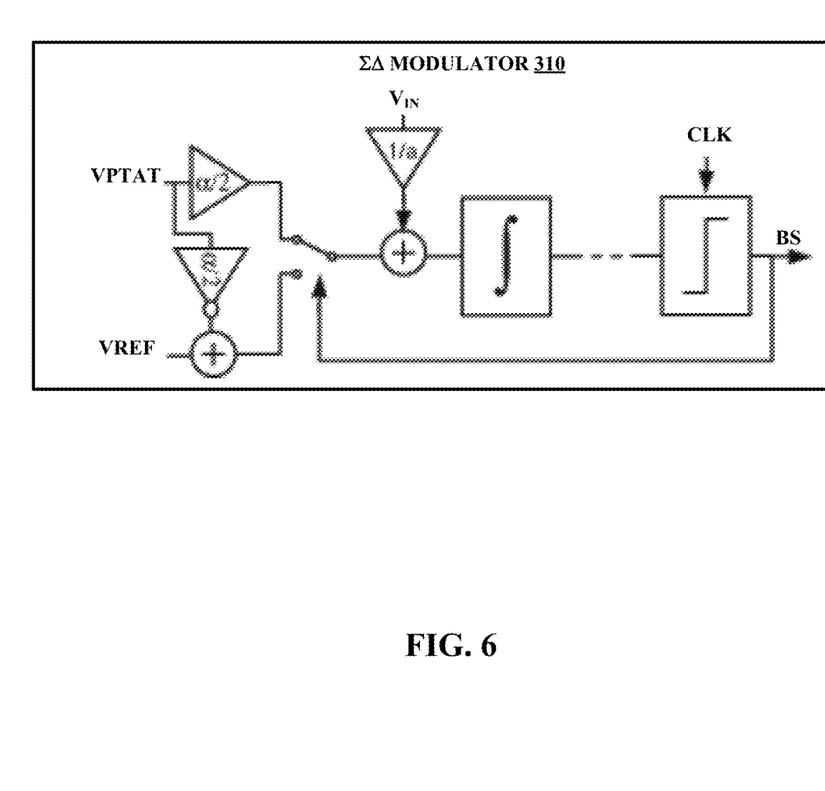
FIG. 6 is a block diagram that shows aspects of the circuitry of FIG. 5 in greater detail.

Specifically, FIG. 2 shows an example integrated circuit (IC) 202 that includes sensor calibration circuitry 204, TV sensor circuitry 206, and IC circuitry 208 logically grouped as circuitry block 210 (although not shown, IC 202 may include multiple instances of circuitry block 210). TV sensor circuitry 206 as illustrated includes TS circuitry 212 and VS circuitry 214. As an example only, IC 202 may correspond to any one product from the TLEx family of products by Infineon Technologies of Neubiberg, Germany, used for automotive applications such as power steering, HVAC compressors and engine cooling fans. As such, the performance of IC circuitry 208 may be sensitive to operational and environmental conditions, and thus TS circuitry 212 and VS circuitry 214 of TV sensor circuitry 206 are, respectively, configured to obtain temperature and voltage readings that may be relayed to other circuitry (not shown) that in turn is configured to manage IC circuitry 208 and insure optimum performance of IC circuitry 208 across a range of conditions. FIGS. 3-4 illustrate TS circuitry 212 of TV sensor circuitry 206 according to an example implementation, while FIGS. 5-6 illustrate VS circuitry 214 of TV sensor circuitry 206 according to an example implementation.

Specifically, FIG. 3 illustrates TS circuitry 212 arranged in a loop topology with sensor calibration circuitry 204 of FIG. 2, as well as digital trim circuitry 302. In this example, TS circuitry 212 includes bias circuitry 304, bipolar core 306, and ADC 308 which in turn includes modulator 310 and decimation filter 312. FIG. 4 illustrates bipolar core 306 and modulator 310 in example detail, whereby the operating principle of TS circuitry 212 as illustrated in FIGS. 3-4 is such that a pair of diode-connected substrate PNP transistors of bipolar core 306 is used to generate voltages $V_{BE}$ and $\Delta V_{BE}$. These voltages, $V_{BE}$ and $\Delta V_{BE}$, are used to produce PTAT and REF voltages, which in turn are converted to a digital temperature reading, $D_{OUT}$, using ADC 308.

In accordance with the present disclosure, it is contemplated that sensor calibration circuitry 204 as shown in FIG. 3 is configured to calibrate TS circuitry 212, equivalently to trim $D_{OUT}$ to compensate for inaccuracies due to process spread (related to fabrication of IC 202), as well as inaccuracies due to the temperature dependency of the saturation current of the substrate PNP transistors of bipolar core 306, by receiving temperature sensor data ($D_{OUT}$) from TS circuitry 212, calculating a trim parameter value α based on temperature sensor data and, based on the trim parameter value α, generating a TRIM signal to control bias circuitry 304 to output $I_{BIAS}$ (see FIG. 3) at a particular magnitude. Modulation of magnitude of $I_{BIAS}$ is an example way to trim $D_{OUT}$ or, equivalently, to calibrate TS circuitry 212, such that the above-mentioned inaccuracies are substantially canceled out. Such an implementation corresponds to an analog trim solution, whereby the output of TS circuitry 212 is obtained from ADC 308. Although a digital trim solution is contemplated which has a result substantially equal to the analog trim solution, if not more accurate, whereby the temperature sensor data ($D_{OUT}$) may be digitally manipulated by digital trim circuitry 302 without any modification to magnitude of $I_{BIAS}$. In this example, the output of TS circuitry 212 is obtained from digital trim circuitry 302.

As mentioned above, FIGS. 5-6 illustrate VS circuitry 214 of TV sensor circuitry 206 according to an example implementation. In general, VS circuitry 214 and TS circuitry 212 of TV sensor circuitry 206 share a number of elements. For example, FIG. 5 illustrates VS circuitry 214 of TV sensor circuitry 206 arranged in a loop topology with sensor calibration circuitry 204 of FIG. 2, as well as digital trim circuitry 302, but also includes curvature lookup 314 which is configured to output a gain adjust to decimation filter 312 based on an output of VS circuitry 214. FIG. 6 illustrates modulator 310 in example detail (in addition to the topology as shown in FIG. 4), and modulator 310 includes an input $V_{IN}$ which corresponds to an input of VS circuitry 214 and an input MODE SELECT, the value of which (e.g., "1" or "0") serves as a command to switch ADC 308 between TS mode and VS mode. In TS mode, the output of ADC 308, or digital trim circuitry 302, corresponds to an output of TS circuitry 212. In VS mode, the output of ADC 308, or digital trim circuitry 302, corresponds to an output of VS circuitry 214.

The operating principle of VS circuitry 212 as illustrated in FIGS. 5-6 is such that the pair of diode-connected substrate PNP transistors of bipolar core 306 is used to generate voltages $V_{BE}$ and $\Delta V_{BE}$. These voltages, $V_{BE}$ and $\Delta V_{BE}$, are used to produce PTAT and REF voltages, which in turn are converted to a digital voltage reading, $D_{OUT}$, based on $V_{IN}$ as input to modulator 310, using ADC 308.

Further, in accordance with the present disclosure, it is contemplated that sensor calibration circuitry 204 as shown in FIG. 5 (and FIG. 3) is configured to calibrate VS circuitry 214, equivalently to trim $D_{OUT}$ to compensate for inaccuracies due to process spread (related to fabrication of IC 202), as well as inaccuracies due to the temperature dependency of the saturation current of the substrate PNP transistors of bipolar core 306, by receiving voltage sensor data ($D_{OUT}$) from VS circuitry 214, calculating a trim parameter value α based on the voltage sensor data and, based on the trim parameter value α, generating a TRIM signal to control bias circuitry 304 to output $I_{BIAS}$ (see FIG. 5) at a particular magnitude. Modulation of magnitude of $I_{BIAS}$ is an example way to trim $D_{OUT}$ or, equivalently, to calibrate VS circuitry 214, such that the above-mentioned inaccuracies are substantially canceled out. Such an implementation corresponds to an analog trim solution, whereby the output of VS circuitry 214 is obtained from ADC 308. Although a digital trim solution is contemplated which has a result substantially equal to the analog trim solution, if not more accurate, whereby the voltage sensor data ($D_{OUT}$) may be digitally manipulated by digital trim circuitry 302 without any modification to magnitude of $I_{BIAS}$. In this example, the output of VS circuitry 214 is obtained from digital trim circuitry 302.

Figure 7:
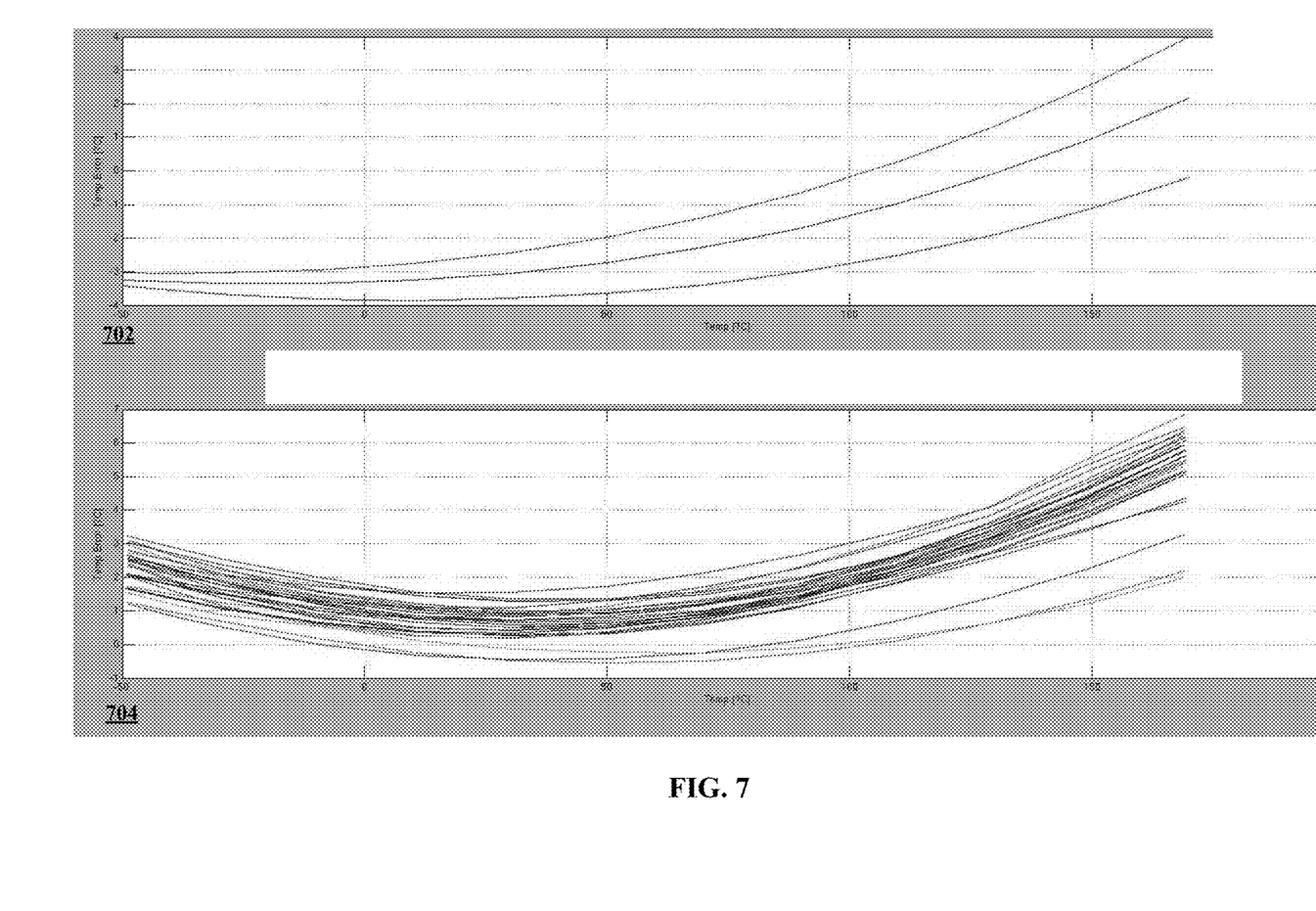
FIG. 7 shows example plots of results without calibrating temperature/voltage sensor circuitry according to the disclosure.
Figure 8:
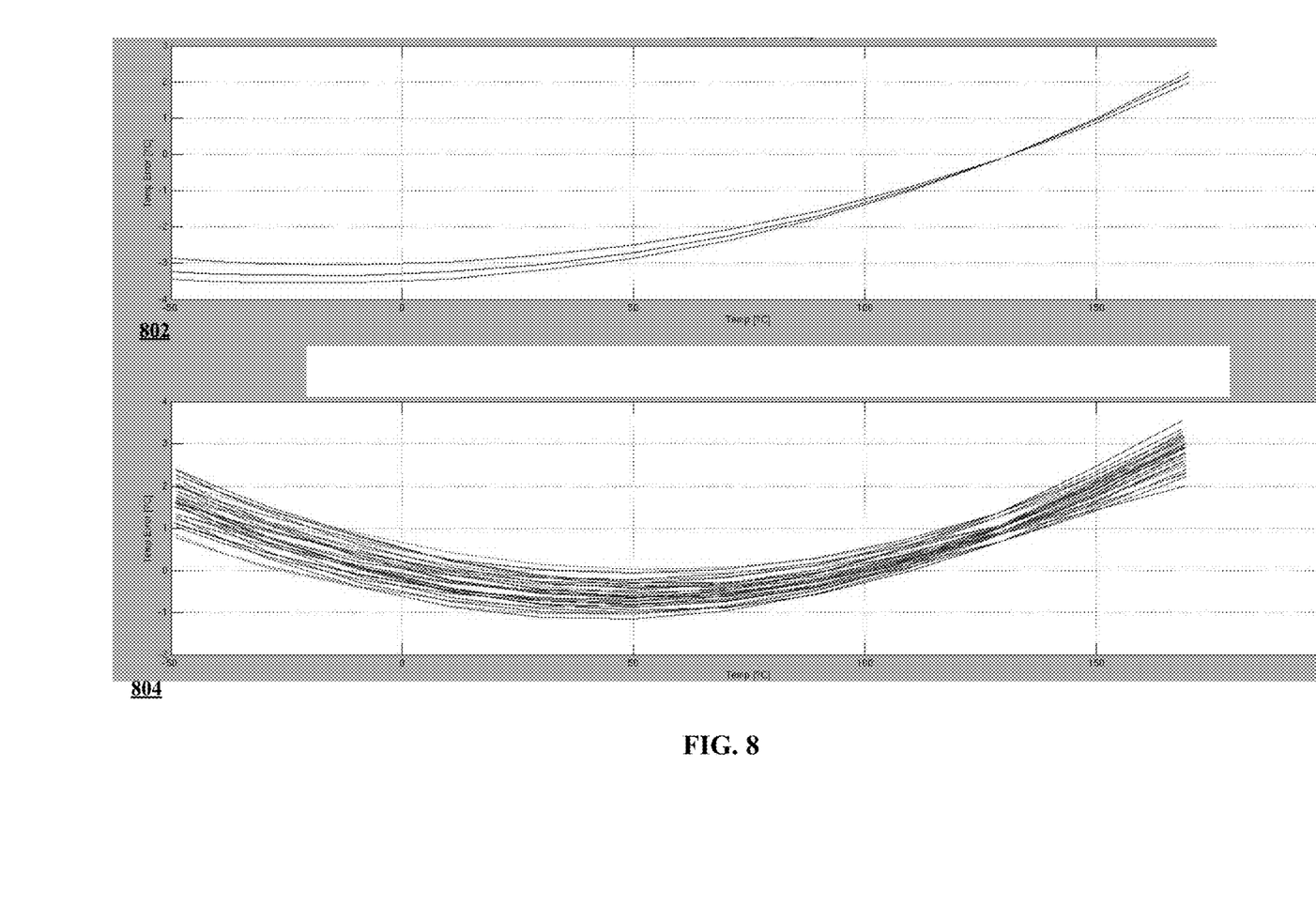
FIG. 8 shows example plots of results with calibrating temperature/voltage sensor circuitry according to the disclosure.

With respect to a sequence for calibrating TS circuitry 212 and VS circuitry 214 as collectively illustrated in FIGS. 3-6, the method 100 of FIG. 1 is applicable whereby a single point calibration of VS circuitry 214 of TV sensor circuitry 206 may first be performed, which is then applicable to TS circuitry 212 of TV sensor circuitry 206. Alternatively, a common single temperature point trim may be implemented whereby a single point calibration of TS circuitry 212 of TV sensor circuitry 206 may first be performed, which is then applicable to VS circuitry 214 of TV sensor circuitry 206. FIGS. 7-8 illustrate a series of plots that indicate example results according to such an implementation.

Specifically, FIG. 7 illustrates a plot 702 (upper) and a plot 704 (lower), and FIG. 8 illustrates a plot 802 (upper) and a plot 804 (lower), whereby the ordinate/abscissa relationship for each one of the plots 702, 704, 802, and 804 is Temp Error (C) versus Temperature (C). In this example, plots 702 and 802 illustrate simulated corners (each trace represents a particular device fabrication process technology) to obtain parameters $A^*\alpha_0=8300$, $\alpha=\alpha_0=11.31$ for the uncalibrated case (plot 702) and parameters $A^*\alpha_0=8300$, $\alpha_0=11.31$, different values of α after calibration 11.31, 11.38, 11.22 for the calibrated case of the present disclosure (plot 802). Plots 704 and 804 on the other hand show trim results of particular measured devices or parts (each trace represents performance of a particular device) for the uncalibrated case (plot 704) and for the calibrated case of the present disclosure (plot 804). Single point trim was performed at T=130° C. Comparing the two cases, the spread of measured errors ~4° C. is smaller for the calibrated parts (804) compared to ~7° C. for the uncalibrated parts (704). Similarly the spread of simulation errors ~5° C. is smaller for the calibrated parts (802) compared to ~8° C. for the uncalibrated parts (702).

As discussed, the present disclosure is directed to techniques for calibrating both temperature sensor circuitry and voltage sensor circuitry of temperature/voltage sensor circuitry by trimming variation in a bandgap reference voltage, which is common between the temperature sensor circuitry and the voltage sensor circuitry, to zero or approximately zero using a single trim value. With the techniques of the present disclosure, high accuracy temperature and voltage sensing may be obtained using a single, common calibration trim value, which is advantageous as temperature and voltage sensing are increasingly needed for a variety of system applications to monitor signals and apply compensation/correction due to environmental factors.

The following numbered examples demonstrate one or more aspects of the disclosure.

Example 1

A method comprising: by sensor calibration circuitry, receiving temperature sensor data or voltage sensor data output by sensor circuitry that is configured to generate temperature and voltage sensor data; calculating a trim parameter value based on the temperature sensor data or the voltage sensor data output by the sensor circuitry; and calibrating, using the trim parameter value, the sensor circuitry to compensate error in the temperature sensor data and the voltage sensor data introduced from the variation in a voltage reference of the sensor circuitry.

Example 2

The method of example 1, further comprising receiving temperature sensor data output by the sensor circuitry, and calculating the trim parameter value from the temperature sensor data output by the sensor circuitry and a calibration temperature value.

Example 3

The method of any one of examples 1-2, further comprising receiving voltage sensor data output by the sensor circuitry; and calculating the trim parameter value from the voltage sensor data output by the sensor circuitry, an input voltage value to the sensor circuitry and a calibration temperature value.

Example 4

The method of any one of examples 1-3, further comprising calibrating in sequence temperature sensor circuitry of the sensor circuitry and then voltage sensor circuitry of the sensor circuitry.

Example 5

The method of any one of examples 1-4, further comprising calibrating in sequence voltage sensor circuitry of the sensor circuitry and then temperature sensor circuitry of the sensor circuitry.

Example 6

The method of any one of examples 1-5, further comprising trimming a bias current or resistor ratio of the sensor circuitry to compensate error in the temperature sensor data and the voltage sensor data.

Example 7

The method of any one of examples 1-6, further comprising digitally processing the temperature sensor data and the voltage sensor data to compensate error in the temperature sensor data and the voltage sensor data.

Example 8

The method of any one of examples 1-7, further comprising calibrating the sensor circuitry to compensate error in the temperature sensor data and the voltage sensor data introduced from variation in a bandgap voltage reference of the sensor circuitry.

Example 9

A circuit comprising: sensor calibration circuitry that is configured to: receive temperature sensor data and voltage sensor data output by sensor circuitry that is configured to generate temperature and voltage sensor data; calculate a trim parameter value based on either the temperature sensor data or the voltage sensor data output by the sensor circuitry; and calibrate, using the trim parameter value, the sensor circuitry to compensate error in the temperature sensor data and the voltage sensor data introduced from variation in a voltage reference of the sensor circuitry.

Example 10

The circuit of example 9, wherein the sensor calibration circuitry is configured to calculate the trim parameter value from the temperature sensor data output by the sensor circuitry and a calibration temperature value.

Example 11

The circuit of any one of examples 9-10, wherein the sensor calibration circuitry is configured to calculate the trim parameter value from the voltage sensor data output by the sensor circuitry, an input voltage value to the sensor circuitry and a calibration temperature value.

Example 12

The circuit of any one of examples 9-11, wherein the sensor calibration circuitry is configured to calibrate in sequence temperature sensor circuitry of the sensor circuitry and then voltage sensor circuitry of the sensor circuitry.

Example 13

The circuit of any one of examples 9-12, wherein the sensor calibration circuitry is configured to calibrate in sequence voltage sensor circuitry of the sensor circuitry and then temperature sensor circuitry of the sensor circuitry.

Example 14

The circuit of any one of examples 9-13, wherein the sensor calibration circuitry is configured to control trim circuitry to trim a bias current or resistor ratio of the sensor circuitry to compensate error in the temperature sensor data and the voltage sensor data Example 15

The circuit of any one of examples 9-14, wherein the sensor calibration circuitry is configured to digitally process the temperature sensor data and the voltage sensor data to compensate error in the temperature sensor data and the voltage sensor data.

Example 16

The circuit of any one of examples 9-15, wherein the sensor calibration circuitry is configured to calibrate the sensor circuitry to compensate error in the temperature sensor data and the voltage sensor data introduced from variation in a bandgap voltage reference of the sensor circuitry.

Example 17

A method comprising: by sensor calibration circuitry configured to calibrate temperature sensor circuitry and voltage sensor circuitry of an integrated circuit using a common trim parameter value, calculating the common trim parameter value for the temperature sensor circuitry and the voltage sensor circuity; and instantiating a sequence to calibrate the temperature sensor circuitry and the voltage sensor circuitry of the integrated circuit using the common trim parameter value.

Example 18

The method of claim 17, further comprising detecting a command that represents selection of the temperature sensor circuity to initially calibrate using the common trim parameter value, over a time interval, calibrating the temperature sensor circuitry using the common trim parameter value, and over a subsequent time interval calibrating the voltage sensor circuitry using the common trim parameter value.

Example 19

The method of any one of claims 17-18, further comprising detecting a command that represents selection of the voltage sensor circuity to initially calibrate using the common trim parameter value, over a time interval, calibrating the voltage sensor circuitry using the common trim parameter value, and over a subsequent time interval, calibrating the temperature sensor circuitry using the common trim parameter value.

Example 20

The method of any one of claims 17-19, further comprising calibrating the temperature sensor circuitry and the voltage sensor circuitry of the integrated circuit using the common trim parameter value by trimming variation in a bandgap reference voltage, that is common to the temperature sensor circuitry and the voltage sensor circuitry, to zero or approximately zero.

Various examples of the disclosure have been described. Any combination of the described systems, operations, or functions is contemplated. These and other examples are within the scope of the following claims.

What is claimed is:

1. A method comprising:
   by sensor calibration circuitry,
      receiving temperature sensor data or voltage sensor data output by sensor circuitry that is configured to generate temperature and voltage sensor data;
      calculating a trim parameter value based on the temperature sensor data or the voltage sensor data output by the sensor circuitry; and
      calibrating, using the trim parameter value, the sensor circuitry to compensate error in the temperature sensor data or the voltage sensor data introduced from variation in a voltage reference of the sensor circuitry.

2. The method of claim 1, further comprising:
   receiving the temperature sensor data output by the sensor circuitry; and
   calculating the trim parameter value from the temperature sensor data output by the sensor circuitry and a calibration temperature value.

3. The method of claim 1, further comprising:
   receiving the voltage sensor data output by the sensor circuitry; and
   calculating the trim parameter value from the voltage sensor data output by the sensor circuitry, an input voltage value to the sensor circuitry and a calibration temperature value.

4. The method of claim 1, further comprising:
   calibrating in sequence temperature sensor circuitry of the sensor circuitry and then voltage sensor circuitry of the sensor circuitry.

5. The method of claim 1, further comprising:
   calibrating in sequence voltage sensor circuitry of the sensor circuitry and then temperature sensor circuitry of the sensor circuitry.

6. The method of claim 1, further comprising:
   trimming a bias current or resistor ratio of the sensor circuitry to compensate error in the temperature sensor data or the voltage sensor data.

7. The method of claim 1, further comprising:
   digitally processing the temperature sensor data or the voltage sensor data to compensate error in the temperature sensor data and the voltage sensor data.

8. The method of claim 1, further comprising:
   calibrating the sensor circuitry to compensate error in the temperature sensor data or the voltage sensor data introduced from variation in a bandgap voltage reference of the sensor circuitry.

9. A circuit comprising:
   sensor calibration circuitry that is configured to:
      receive temperature sensor data and voltage sensor data output by sensor circuitry that is configured to generate temperature and voltage sensor data;
      calculate a trim parameter value based on either the temperature sensor data or the voltage sensor data output by the sensor circuitry; and
      calibrate, using the trim parameter value, the sensor circuitry to compensate error in the temperature sensor data and the voltage sensor data introduced from variation in a voltage reference of the sensor circuitry.

10. The circuit of claim 9, wherein the sensor calibration circuitry is configured to:
    calculate the trim parameter value from the temperature sensor data output by the sensor circuitry and a calibration temperature value.

11. The circuit of claim 9, wherein the sensor calibration circuitry is configured to:
    calculate the trim parameter value from the voltage sensor data output by the sensor circuitry, an input voltage value to the sensor circuitry and a calibration temperature value.

12. The circuit of claim 9, wherein the sensor calibration circuitry is configured to:
    calibrate in sequence temperature sensor circuitry of the sensor circuitry and then voltage sensor circuitry of the sensor circuitry.

13. The circuit of claim 9, wherein the sensor calibration circuitry is configured to:
    calibrate in sequence voltage sensor circuitry of the sensor circuitry and then temperature sensor circuitry of the sensor circuitry.

14. The circuit of claim 9, wherein the sensor calibration circuitry is configured to:

control trim circuitry to trim a bias current or resistor ratio of the sensor circuitry to compensate error in the temperature sensor data and the voltage sensor data.

15. The circuit of claim 9, wherein the sensor calibration circuitry is configured to:
digitally process the temperature sensor data and the voltage sensor data to compensate error in the temperature sensor data and the voltage sensor data.

16. The circuit of claim 9, wherein the sensor calibration circuitry is configured to:
calibrate the sensor circuitry to compensate error in the temperature sensor data and the voltage sensor data introduced from variation in a bandgap voltage reference of the sensor circuitry.

17. A method comprising:
by sensor calibration circuitry configured to calibrate temperature sensor circuitry and voltage sensor circuitry of an integrated circuit using a common trim parameter value,
calculating the common trim parameter value for the temperature sensor circuitry and the voltage sensor circuitry; and
calibrating the temperature sensor circuitry and the voltage sensor circuitry of the integrated circuit using the common trim parameter value.

18. The method of claim 17, further comprising:
detecting a command that represents selection of the temperature sensor circuity to initially calibrate using the common trim parameter value;
over a time interval, calibrating the temperature sensor circuitry using the common trim parameter value; and
over a subsequent time interval, calibrating the voltage sensor circuitry using the common trim parameter value.

19. The method of claim 17, further comprising:
detecting a command that represents selection of the voltage sensor circuity to initially calibrate using the common trim parameter value;
over a time interval, calibrating the voltage sensor circuitry using the common trim parameter value; and
over a subsequent time interval, calibrating the temperature sensor circuitry using the common trim parameter value.

20. The method of claim 17, further comprising:
calibrating the temperature sensor circuitry and the voltage sensor circuitry of the integrated circuit using the common trim parameter value by trimming variation in a bandgap reference voltage, that is common to the temperature sensor circuitry and the voltage sensor circuitry, to zero or approximately zero.

21. A circuit comprising sensor calibration circuitry configured to calibrate temperature sensor circuitry and voltage sensor circuitry of an integrated circuit using a common trim parameter value, wherein the circuit is configured to:
calculate the common trim parameter value for the temperature sensor circuitry and the voltage sensor circuity; and
calibrate the temperature sensor circuitry and the voltage sensor circuitry of the integrated circuit using the common trim parameter value.

22. The circuit of claim 21, wherein the circuit is configured to:
detect a command that represents selection of the temperature sensor circuity to initially calibrate using the common trim parameter value;
over a time interval, calibrate the temperature sensor circuitry using the common trim parameter value; and
over a subsequent time interval, calibrate the voltage sensor circuitry using the common trim parameter value.

23. The circuit of claim 21, wherein the circuit is configured to:
detect a command that represents selection of the voltage sensor circuity to initially calibrate using the common trim parameter value;
over a time interval, calibrate the voltage sensor circuitry using the common trim parameter value; and
over a subsequent time interval, calibrate the temperature sensor circuitry using the common trim parameter value.

24. The circuit of claim 21, wherein the circuit is configured to:
calibrate the temperature sensor circuitry and the voltage sensor circuitry of the integrated circuit using the common trim parameter value by trimming variation in a bandgap reference voltage, that is common to the temperature sensor circuitry and the voltage sensor circuitry, to zero or approximately zero.

\* \* \* \* \*